(12) United States Patent
Chen et al.

(10) Patent No.: US 7,239,197 B2
(45) Date of Patent: Jul. 3, 2007

(54) GM-C TIME CONSTANT TUNING CIRCUIT

(75) Inventors: Kuan-Ta Chen, Taipei Hsien (TW); Joanna Lin, Taipei Hsien (TW)

(73) Assignee: VIA Technologies Inc, Hsin-Tien City, Taipei Hsien (TW)

( * ) Notice: Subject to any disclaimer, the term of this patent is extended or adjusted under 35 U.S.C. 154(b) by 0 days.

(21) Appl. No.: 11/164,659

(22) Filed: Nov. 30, 2005

(65) Prior Publication Data

US 2006/0192613 A1   Aug. 31, 2006

Related U.S. Application Data

(60) Provisional application No. 60/593,846, filed on Feb. 17, 2005.

(51) Int. Cl.
*H03K 5/00* (2006.01)

(52) U.S. Cl. ...................... 327/553; 327/552

(58) Field of Classification Search ......... 327/552–559
See application file for complete search history.

(56) References Cited

U.S. PATENT DOCUMENTS 6,194,958 B1 * 2/2001 Goldfarb et al. ............ 327/552
6,400,932 B1 * 6/2002 Oh et al. ................. 455/150.1

* cited by examiner

*Primary Examiner*—Dinh T. Le
(74) *Attorney, Agent, or Firm*—Winston Hsu

(57) ABSTRACT

A circuit including a Gm-C filter and an automatic Gm-C time constant tuning circuit is provided. The tuning circuit includes a reference conductor, a reference capacitor coupled to the reference conductor, a comparator generating signals according to a reference signal and the voltage signal at the output of the reference conductor, a feedback capacitor, and a charge pump charging and discharging a feedback capacitor according to the output of the comparator. The feedback capacitor provides a control voltage feedback to the tuning circuit and to the Gm-C filter for adjusting the conductance. Hence, in doing so, errors like manufacturing variation and offset can be prevented.

22 Claims, 8 Drawing Sheets

GM-C TIME CONSTANT TUNING CIRCUIT

CROSS REFERENCE TO RELATED APPLICATIONS

This application claims the benefit of U.S. Provisional Application No. 60/593,846, filed Feb. 17, 2005, and included herein by reference.

BACKGROUND OF THE INVENTION

1. Field of the Invention

The present invention relates to a Gm-C filter of a semi-conductor component, and more particularly to an automatic tuning Gm-C filter of a Gm-C time constant tuning circuit of a semi-conductor component.

2. Description of the Prior Art

A filter is required in most communication transmission application circuits. In general, a discrete-time filter can control a bandwidth more accurately, but the discrete-time filter is preferably more suited for a narrow bandwidth. A high frequency broadband circuit generally utilizes a continuous-time filter; and for the high frequency broadband circuit, a Gm-C filter will be a better choice, as its power consumption is low. The most common problems found in the Gm-C filter is that there is always a variation of 30% to 50% during the manufacturing of circuit components in an integrated circuit, and the variation of a capacitance is approximately 10% to 20%. The degree of variation causes a slight difference in the actual value and the preset value of a filter of Gm-C time constant. As a result, the accuracy of the bandwidth of the filter is affected. Therefore, this approach is disadvantageous for a circuit that requires accurate frequency response. In addition, when the circuit is operating, the Gm-C time constant changes, according to temperature, voltage, and so on. These environmental changes cause a great offset to be generated such that the frequency response of the Gm-C filter cannot be amended immediately and the efficiency and accuracy of the circuit is therefore further affected. In a typical modern technology environment, the semi-conductor component that utilizes the Gm-C filter is generally coupled with an additional auto tuning circuit. The additional auto tuning circuit is required to overcome the problem of cut off frequency offset due to the changes in the operating environment.

In practice, there are two most applicable methods utilized to tune the Gm-C time constant of the filter. The first common method is to utilize a phase lock loop (PLL) to lock a frequency, wherein a portion or a whole of a VCO that collocates with the PLL is copied to tune the Gm-C time constant of the filter. Additionally, feedback signals from other circuits are collocated to control the conductance value of the Gm-C time constant of the filter. For example, John M. Khoury published an article on "Design of a 15-MHz CMOS Continuous-Time Filter with On-chip Tuning" in the IEEE Journal of Solid-state Circuit. In this article, Khoury discloses a five-level filter that utilizes PLL to adjust cut off frequency. However, the main disadvantage present in Khoury's five-level filter is that this type of circuit has a great surface area and therefore its power consumption is high; also the completion time taken for tuning is long and the tuning speed can be very slow as the Gm-C time constant can only be adjusted after the PLL is settled.

The second conventional method of tuning is to copy a portion of conductance and capacitance of the Gm-C time constant of the filter utilizing a method of integration to obtain a ratio of conductance to capacitance and collocating feedback signals from other circuits to control the conductance value. For example, Iuri Mehr and David R. Welland published an article on "A CMOS Continuous-Time Gm-C Filter for PRML Read Channel Application at 150 Mb/s and Beyond" in the IEEE Journal of Solid-state Circuit, they teach the utilization of an integrated circuit to obtain a plurality of ratios of conductance to capacitance similar to the ratio of conductance to capacitance of the variation filter such that the cut off frequency of the filter can be adjusted.

Please refer to FIG. 1. FIG. 1 illustrates a diagram of a conventional Gm-C filter of a Gm-C time constant tuning circuit 100. A reference conductor 110 is a copied portion of a conductance Gm of the filter of the Gm-C time constant being tuned by the tuning circuit 100. It represents that the reference conductor 110 and the conductance Gm of the initial filter has the same characteristics, which causes the same degree in variation in manufacturing. A reference capacitor 120 is a copied portion a capacitance C of the filter of the Gm-C time constant being tuned by the tuning circuit 100. It represents that the reference capacitor 120 and the capacitance C of the initial filter has the same characteristics, which causes the same degree in variation in manufacturing. As shown in FIG. 1, the reference conductor 110 receives a reference voltage Vref and the output terminal coupled to the reference capacitor 120 to form a time variable voltage signal Vs1(t). The output terminal of the reference conductor 110 then couples to the two switches 132 and 134 according to a clock signal clk1 coupled to negative terminals of two comparators 142 and 144. The positive terminals of the comparators 142 and 144 receive two reference voltages Vtp, Vtm, the output terminal then connects to a digital logic unit 150. The digital logic unit 150 outputs two signals Up, Dn according to outputs from the comparators 142, 144 and a second clock signal clk2. The signals Up and Dn are outputted to a charged pump 160. The charged pump then outputs a current Icp1. After the current Icp1 flows through a filter 170, a control voltage Vcon1 is feedback to the reference conductor 110 to control the conductance value of the reference conductor 110. Wherein the conductance value of the reference conductor 110 is represented as gm, and the capacitance of the capacitor 120 is represented as c1, thus the formula of time variable signal Vs1(t) is as shown below:

$$Vs1(t) = Vref \cdot gm/c1 \cdot t \quad \text{Formula(1)}$$

Please refer to FIG. 2. FIG. 2 illustrates a variable graph indicating the voltage signal Vs1(t), Up1, and Dn1 of FIG. 1 with respect to time wherein the reference voltages Vtp and Vtm are positioned at horizontal dotted lines with the time variable voltage signal Vs1(t), and Tclk1 and Tclk2 are cycle lengths of the clock signals clk1, clk2 respectively, and Tdn1 and Tup1 represent high voltage time periods for the voltage signals Up1 and Dn1 respectively. In coordinating with FIG. 2, the feedback of FIG. 1 must be stable and the length of the voltage signal Up1 and Dn1 are also required to be equal, which means that the length of Tdn1 and Tup1 are to be equal as well. It can be concluded from FIG. 1 and FIG. 2 that:

$$Vs1(4 \cdot T_{clk2}) = (Vtm + Vtp)/2 \quad \text{Formula(2)}$$

In combining formula 1 and formula 2 the following formula can be obtained:

$$Vref \cdot gm/c1 \cdot (4 \cdot T_{clk2}) = (Vtm + Vtp)/2 \quad \text{Formula(3)}$$

The ratio gm/c1 of the reference conductor 110 and the reference capacitor 120 can be determined through formula (3). Thus the Gm-C time constant Gm/C of the filter of the Gm-C time constant being tuned by the tuning circuit 100 can be reintroduced. When the Gm-C time constant Gm/C of the filter of the Gm-C time constant being tuned is known, then the methods such as adjusting the control voltage, can be utilized to adjust the conductance value of the filter of the Gm-C time constant being tuned to correct the Gm-C time constant.

However, although the resulting tuning speed of the conventional integration method of FIG. 1 for tuning the Gm-C time constant of the tuning circuit 100 is much faster than utilizing the PLL to tune a circuit, there remain many inevitable defects still present given this approach. Firstly, although the reference conductor 110 and the reference capacitor 120 each are only required to copy a portion of the original conductance and capacitor, the latter process is still complicated. In addition, the two comparators 142, 144 take up a large portion of surface area in the circuit. Moreover, as the charged pump charges and discharges electricity on the filter 170 according to the voltage signal Up1 and Dn1, according to FIG. 2, the voltage signals Up1 and Dn1 are two non-overlapping voltage signals, which means that even if the tuning circuit 100 is stable, the charged pump 160 still continues to charge and discharge electricity on the filter 170; therefore the control voltage Vcon1 being feedback to the reference conductor 110 by the filter 170 is still in vibration and is not a fixed value. Lastly, the variation in manufacturing will also affect other parameters such as the accuracy of the reference voltages Vtm, Vtp; these will affect the conductance and capacitance constant of the filter being tuned according to the ratio of the reference conductor 110 to the reference capacitor 120 which also affects the efficiency of the frequency response of the Gm-C filter and the entire circuit.

SUMMARY OF THE INVENTION

Therefore the claimed invention provides a semi-conductor component and a tuning circuit each having a Gm-C filter to continuously tune a Gm-C time constant of the filter according to a ratio of a copied portion of conductance to capacitance by utilizing an integration method and a simple circuit design to solve the problem of the above-mentioned prior art.

The claimed invention discloses a semi-conductor component having a Gm-C filter. The Gm-C filter comprises a set of conductors and a set of capacitors, and a tuning circuit for tuning the Gm-C time constant of the Gm-C filter. The tuning circuit comprises a reference conductor for outputting a current signal according to a voltage signal and a control signal, an output terminal of the reference conductor coupled to a reference signal according to a clock signal; a reference capacitor coupled to the output terminal of the reference conductor; a comparator coupled to the output terminal of the reference conductor for outputting a first signal according to a relation between the signals received; a charged pump for outputting a current according to the first signal and a reference signal outputted by the comparator; and a feedback capacitor coupled to the charged pump for generating a control voltage according to the current outputted by the charged pump. The feedback capacitor is further coupled to the reference conductor and the set of conductors of the Gm-C filter; the reference conductor and the set of conductors of the Gm-C filter adjust a conductance value according to the control voltage generated by the feedback capacitor.

These and other objectives of the present invention will no doubt become obvious to those of ordinary skill in the art after reading the following detailed description of the preferred embodiment that is illustrated in the various figures and drawings.

DETAILED DESCRIPTION

The present invention utilizes the integration method of the second conventional technology. This method is utilized to obtain the Gm-C time constant Gm/C of the Gm-C filter, but in the present invention the circuit has been simplified and the Gm-C time constant can be adjusted in continuous-time while the Gm-C filter is in an operating status thereby enabling the present invention to efficiently correct the offset generated by temperature and voltage changes in frequency response of the Gm-C filter when the circuit is operating.

Figure 1:
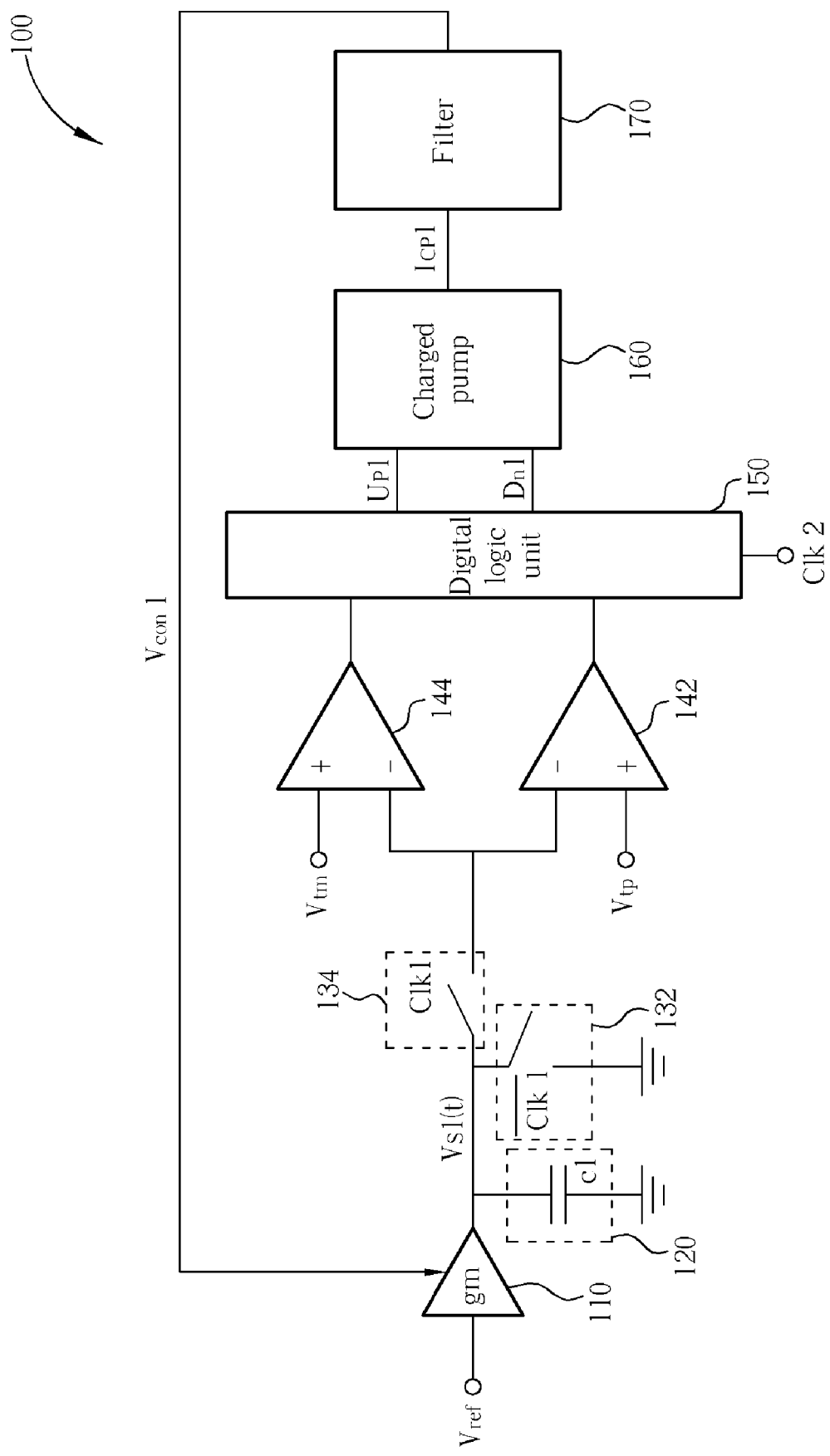
FIG. 1 illustrates a diagram of a conventional Gm-C time constant tuning circuit.
Figure 2:
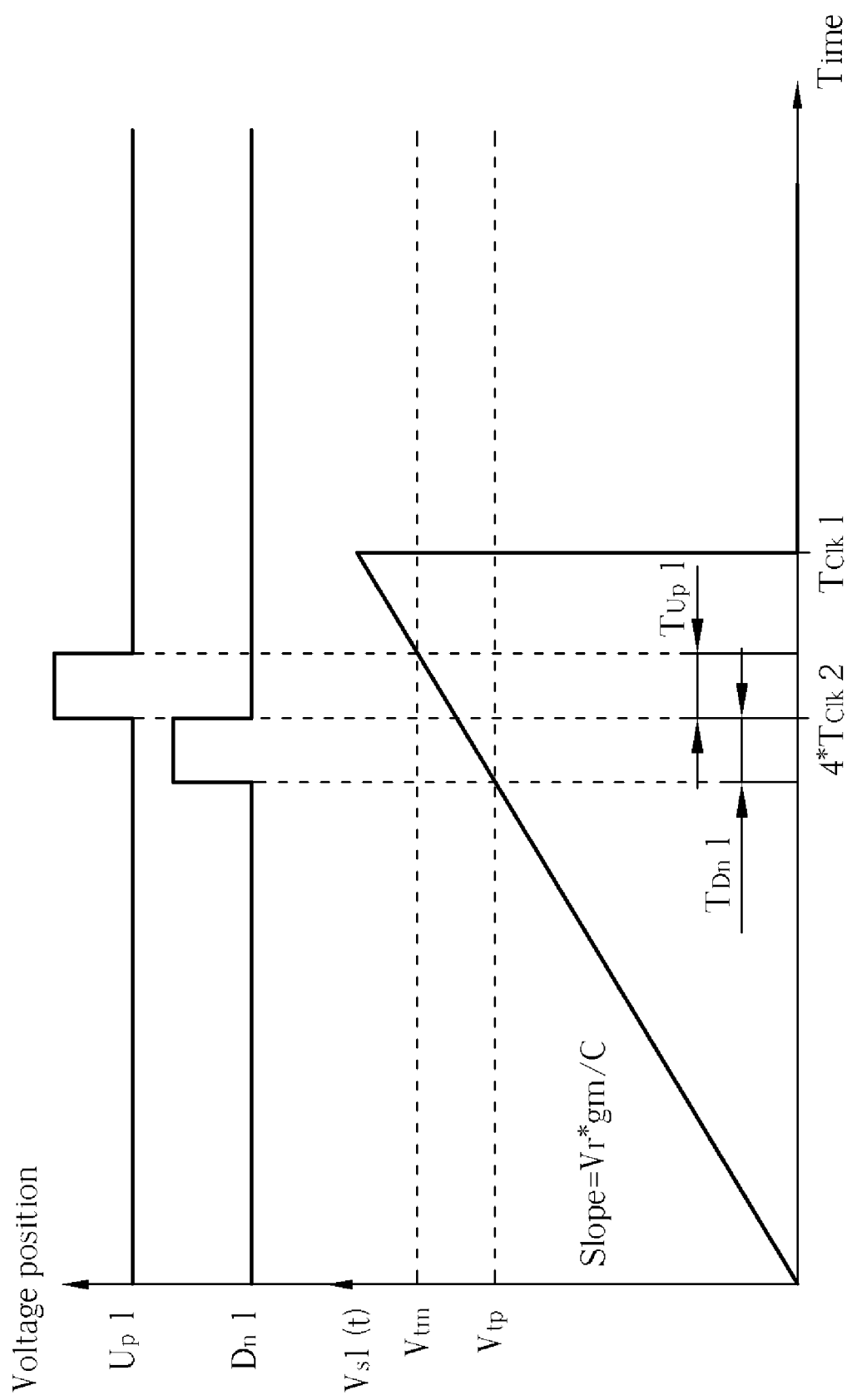
FIG. 2 illustrates a variable graph of voltage signal Vs1(t), Up1 and Dn1 with respect to time.
Figure 3:
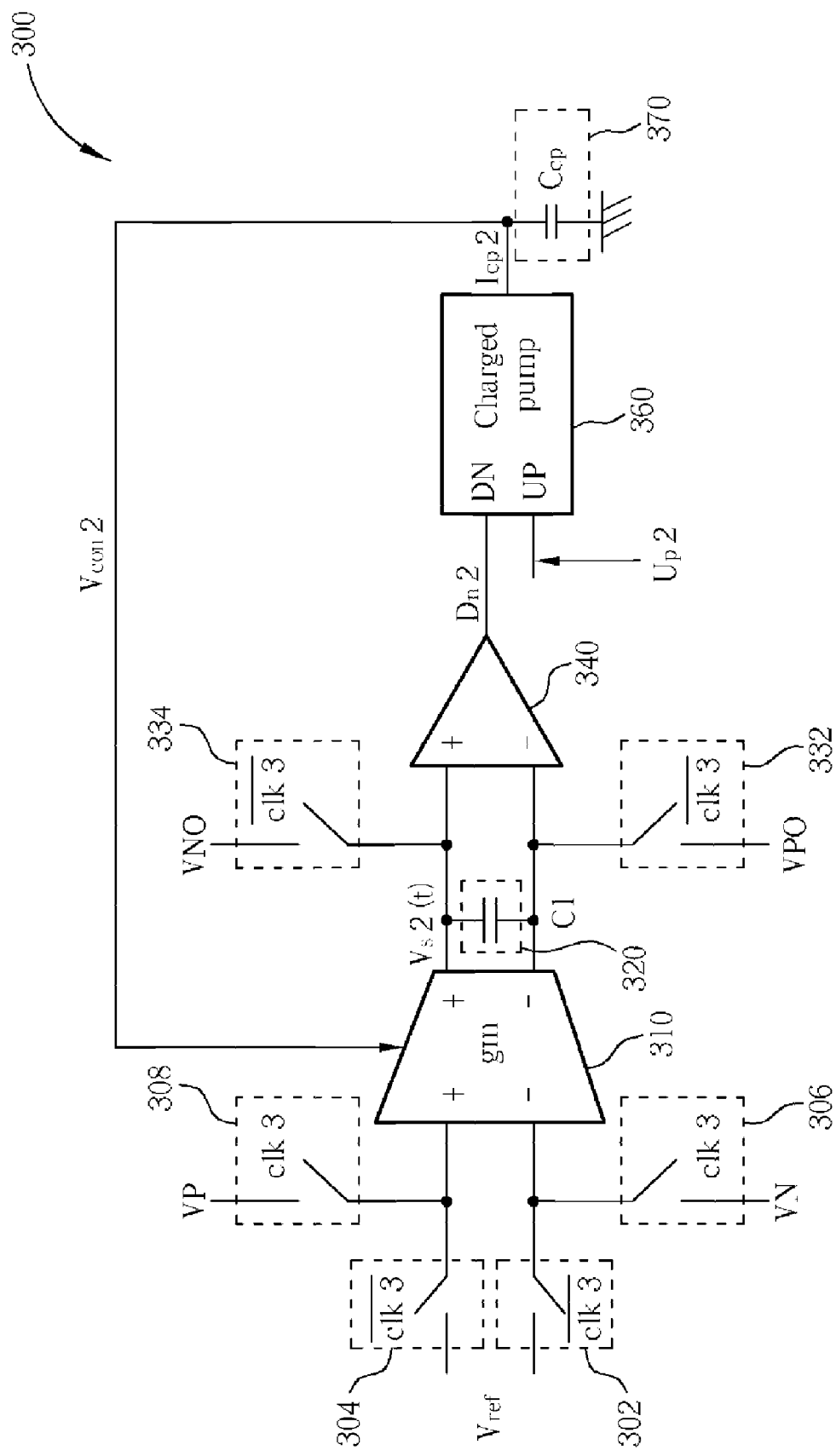
FIG. 3 illustrates a diagram of a Gm-C time constant of a tuning circuit.

Please refer to FIG. 3. FIG. 3 illustrates a diagram of a Gm-C time constant of a tuning circuit 300. A reference conductor 310 is a copied portion of a conductance Gm of the filter of the Gm-C time constant being tuned by the tuning circuit 300. It represents that the reference conductor 310 and the conductance Gm of the initial filter has the same characteristics, which causes the same degree in variation in manufacturing; and conductance of the reference conductor 310 is gm. A reference capacitor 320 is a copied portion of a capacitance C of the filter of the Gm-C time constant being tuned by the tuning circuit 300. It represents that the reference capacitor 320 and the capacitance C of the initial filter has the same characteristics, which causes the same degree in variation in manufacturing; and the capacitance value of the reference capacitor 320 is c1. In order to achieve the objective of a reduction in surface area and power, the reference conductor 310 and the reference capacitor 320 can be a smallest conductor and a smallest capacitor of the Gm-C filter of the conductance and capacitance constant being tuned by the tuning circuit 300.

FIG. 3 illustrates an embodiment of a tuning circuit with a Gm-C time constant according to the present invention. In this example, the circuit is implemented in a differential structure. An input terminal of the reference conductor 310 is connected to switches 302, 304, 306, and 308 and is also coupled to a reference voltage Vref and a reference voltages VN, VP alternatively according to a clock signal clk3; an output terminal of the reference conductor 310 is connected to the reference capacitor 320 to form a time variable voltage signal Vs2(t). In comparison to the conventional tuning circuit 100, the tuning circuit 300 of the present invention utilizes a comparator 340 coupled to the output port of the reference conductor 310. An input terminal of the comparator 340 is further coupled to switches 332, 334 and is connected to two reference voltages VPO, VNO according to the clock signal clk3.

In the first embodiment 300 of the tuning circuit according to the present invention, an output port of the comparator 340 is directly coupled to a charged pump 360. The charged pump 360 outputs a current Icp2 according to an output signal Dn2 of the comparator 340 and a reference signal Up2. After the current Icp2 flows through a feedback capacitor 370, a control voltage Vcon2 is outputted and feedback to the reference conductor 310 to control a conductance value of the reference conductor 310. The tuning circuit 300 of the present invention utilizes reference signals listed in the following:

$$VP = Vref + 0.5 \cdot VB \qquad \text{Formula(4)}$$

$$VN = Vref - 0.5 \cdot VB \qquad \text{Formula(5)}$$

$$VPO = Vref + 0.5 \cdot K \cdot VB \qquad \text{Formula(6)}$$

$$VNO = Vref - 0.5 \cdot K \cdot VB \qquad \text{Formula(7)}$$

Wherein, Vref inputs into a common mode voltage of the reference conductor 310, VB is a predetermined voltage set by a designer and the end result will not be affected; and K is a constant set by the designer to be a free parameter. The following relation can be obtained from Formula (4) through formula (7):

$$VP - VN = VB \qquad \text{Formula(8)}$$

$$VPO - VNO = K \cdot VB \qquad \text{Formula(9)}$$

Figure 4:
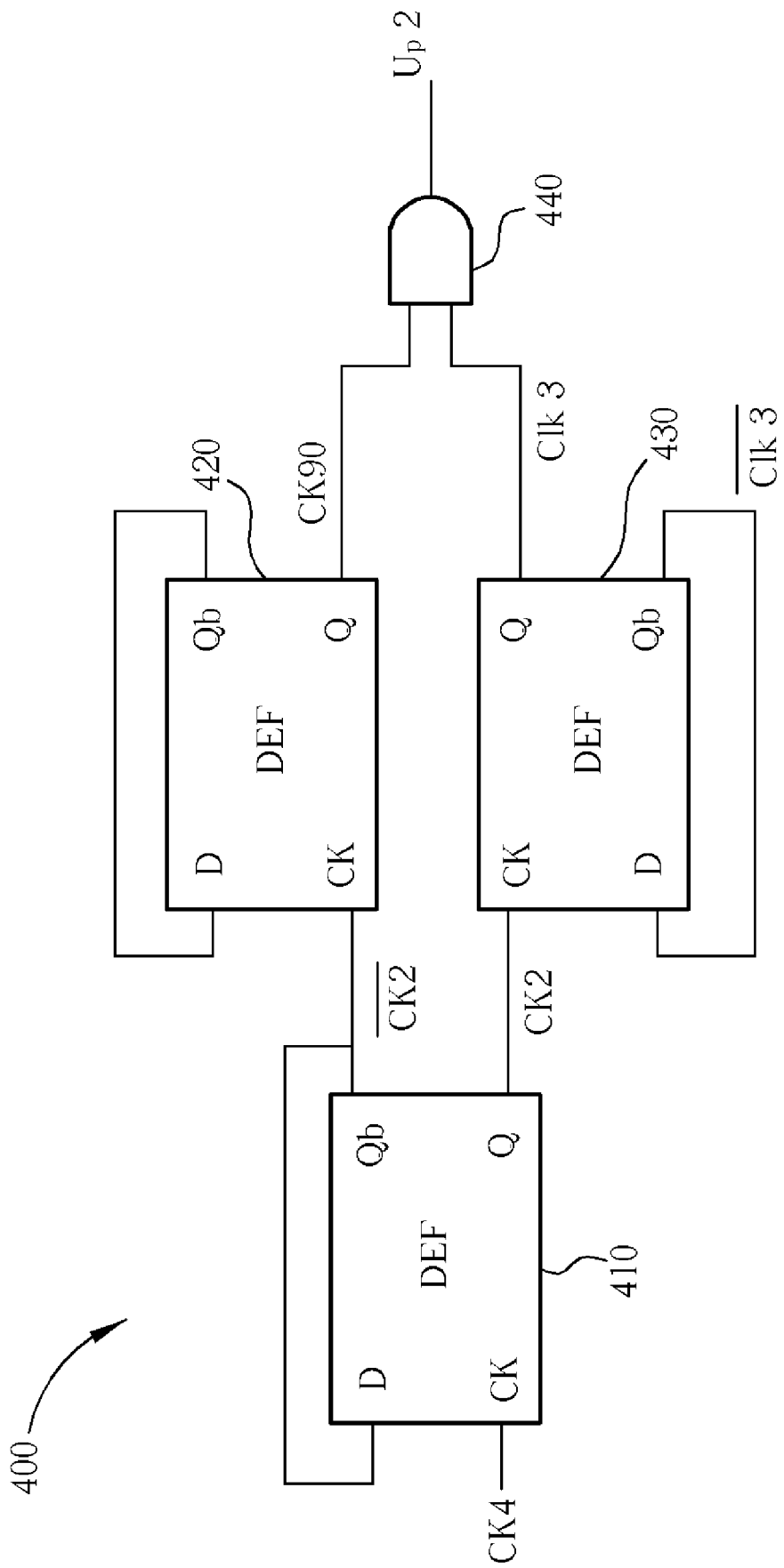
FIG. 4 illustrates a diagram of a clock generating circuit.
Figure 5:
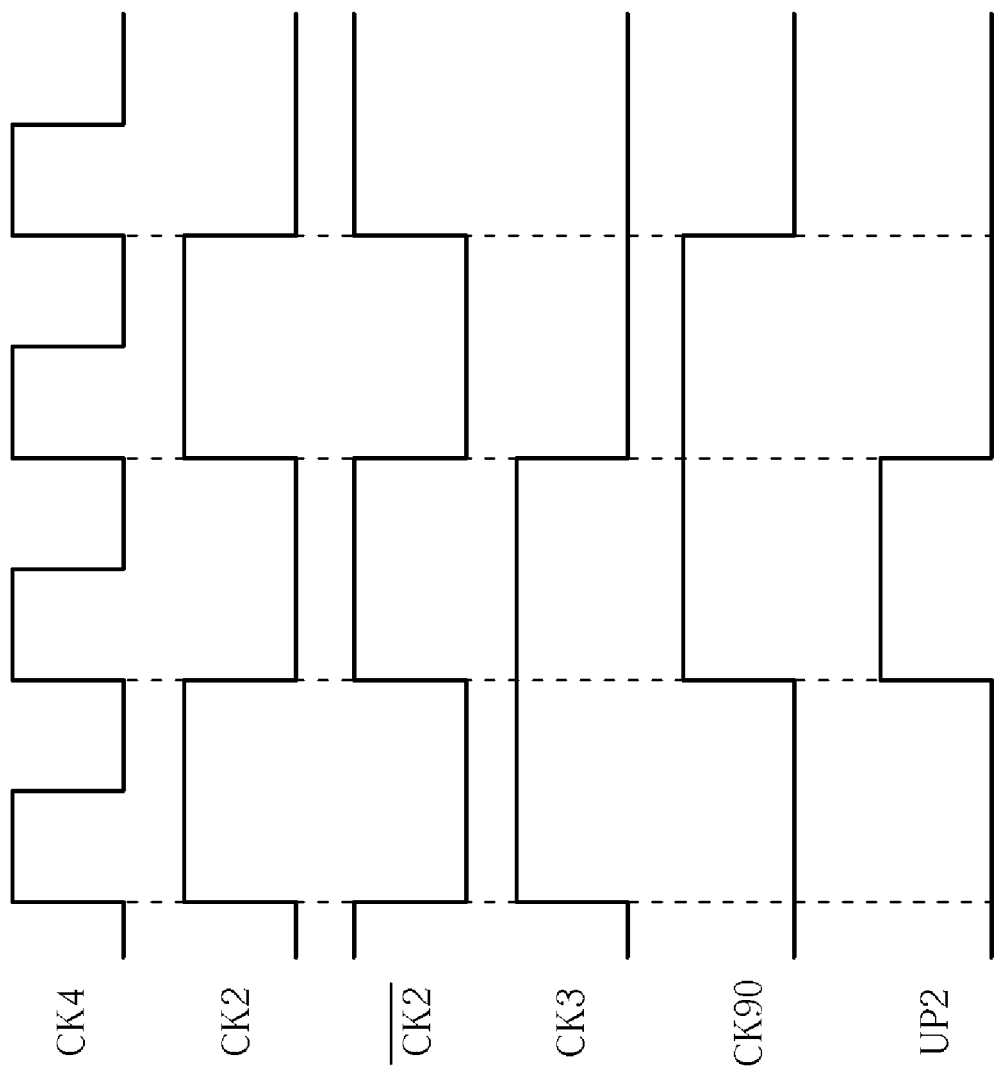
FIG. 5 illustrates a diagram of clocks signals corresponding to the clock signals of FIG. 4.

Please refer to FIG. 4 and FIG. 5. FIG. 4 illustrates a diagram of a clock generating circuit 400 generating a clock signal clk3 utilized by the tuning circuit 300 of the present invention. FIG. 5 illustrates a diagram of clock signals corresponding to the clock signals of FIG. 4. The clock generating circuit 400 comprises three 2-divider units 410, 420 and 430 and an AND gate 440. The clock signal clk3 is obtained by dividing a clock signal CK4 by two twice, therefore a duty cycle of the clock signal clk3 must be 50%, and the duty cycle of the clock signal clk3 is not related to a duty cycle of the clock signal CK4, yet the difference between a clock signal CK90 and the clock signal clk3 must be 90 degrees.

Please refer to FIG. 3 and at the same time FIG. 4 and FIG. 5. The clock signal clk3 is a low potential half period, the input terminal of the reference conductor 310 is being reset to the reference voltage Vref, the output terminal is being reset to the reference voltages VNO and VPO, and a differential input will be set to the product of −K and VB. Therefore, the output of the comparator 340 is low potential and the charged pump 360 at the Dn terminal does not receive any pulse. When the clock signal clk3 is a high potential half period, the input terminal of the reference conductor 310 will be coupled to the reference voltages VP and VN, and the differential output will be VB. At this time, the reference conductor 310 begins to integrate the reference capacitor 320 at a speed of the product of (VB) times (gm/cl) to offset the original −K. VB, an output transition of the comparator becomes high potential, the output signal Dn2 then transmits a pulse to the charged pump 360 such that the current discharges electricity to the feedback capacitor 370. Set the reference conductor 310 to integrate the reference capacitor 320 until the output transition of the comparator 340 becomes a high potential and the time length becomes T, then:

$$VB \cdot gm/cl \cdot T = K \cdot VB \qquad \text{Formula(10)}$$

From formula 10:

$$gm/cl \cdot T = K \qquad \text{Formula(11)}$$

VB is being deleted, as in the above-mentioned the result is not affect.

In FIG. 3, a voltage Vcon2 is obtained by the current outputted by the charged pump 360 onto the feedback capacitor 370. The voltage Vcon2 is then feedback to the reference conductor 310 to adjust the size of the conductance value and indirectly changing T of integration until the tuning circuit is stable. When pulse lengths of the signals Dn2 and Up2 received by the charged pump 360 are equal, the charged pump 360 will enter into a stable state and will not charge or discharge the feedback capacitor 370. As shown in FIG. 4, the tuning circuit 300 of the present invention is capable of utilizing a clock generating circuit 400 to generate the reference signal Up2; and according to the circuit of FIG. 4, a cycle length of the reference signal Up2 and a cycle length of the clock signal clk3 are equal, and the pulse length is ¼ of a cycle. Therefore, when the tuning circuit 300 is stable, the pulse length of the output signal Dn2 of the comparator 340 should be ¼ cycle length of the clock signal clk3. Therefore, it can be preset as:

$$T = 0.5 \cdot T_{clk3} - 0.25 \cdot T_{clk3} = 0.25 \cdot T_{clk3} \qquad \text{Formula(12)}$$

Wherein, $T_{clk3}$ represents the cycle length of the clock signal clk3.

In formula 11, after the gm, cl, and T have been decided, the leftover constant K will then be decided; K can be decided according to the size of the copied reference conductor and the copied reference capacitor, and the speed of the clock signal clk3, as long as the value K does not exceed to a value which causes the output of the reference conductor 310 to saturate. Thus, this gives the designer greater freedom in selecting the conductance gm of the reference conductor, the capacitance cl of the reference capacitor, and the speed of the clock signal clk3.

Figure 6:
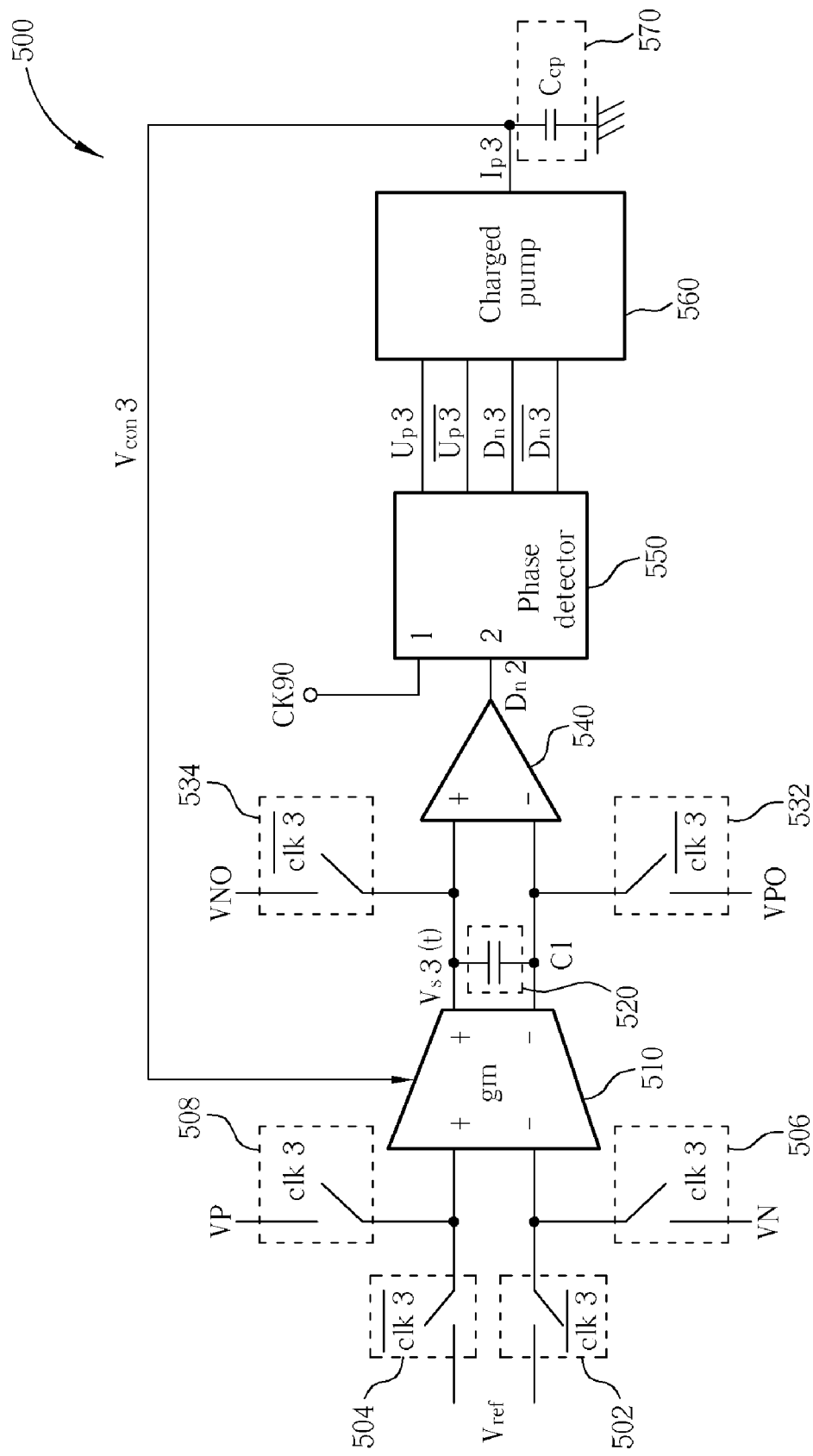
FIG. 6 illustrates a diagram of a second embodiment of the Gm-C time constant tuning circuit.

Please refer to FIG. 6. FIG. 6 illustrates a diagram of a second embodiment 500 of the Gm-C time constant tuning circuit. The architecture of a first half of the second embodiment 500 of the tuning circuit is similar to the first embodiment 300 of FIG. 3, but the second embodiment 500 further comprises a phase detector 550. As shown in FIG. 6, an input terminal of a reference conductor 510 is connected to switches 502, 504, 506, 508 and is also coupled to the reference voltage Vref and the reference voltage VN and VP alternatively; an output terminal of the reference conductor 510 is connected to a reference capacitor 520 to form a time varying voltage signal Vs(t). An input terminal of a comparator 540 is coupled to switches 532 and 534 and is also connected the reference voltage VPO and VNO according to the clock signal clk3. In the second embodiment 500 of the tuning circuit of the present invention, an output terminal of the comparator 540 is not directly coupled to a charged pump 560 but is first connected to the phase detector 550. The phase detector 550, according to a phase of an output signal Dn2 of the comparator 540 and a clock signal CK90, outputs the comparison result to the charged pump 560. The charged pump 560 then outputs a current Icp3 according to an output signal of the phase detector 550. After the current Icp3 flows through a feedback capacitor 570, a control voltage Vcon3 is outputted and feedback to the reference conductor 510 to control a conductance value of the reference conductor 510. Wherein definitions and relations of the reference signals Vref, Vn, VPO, VNO and clk3 and the corresponding reference signals of FIG. 3 are similar, and difference between the clock signal CK90 and the clock signal clk3 is 90 degrees.

Figure 7:
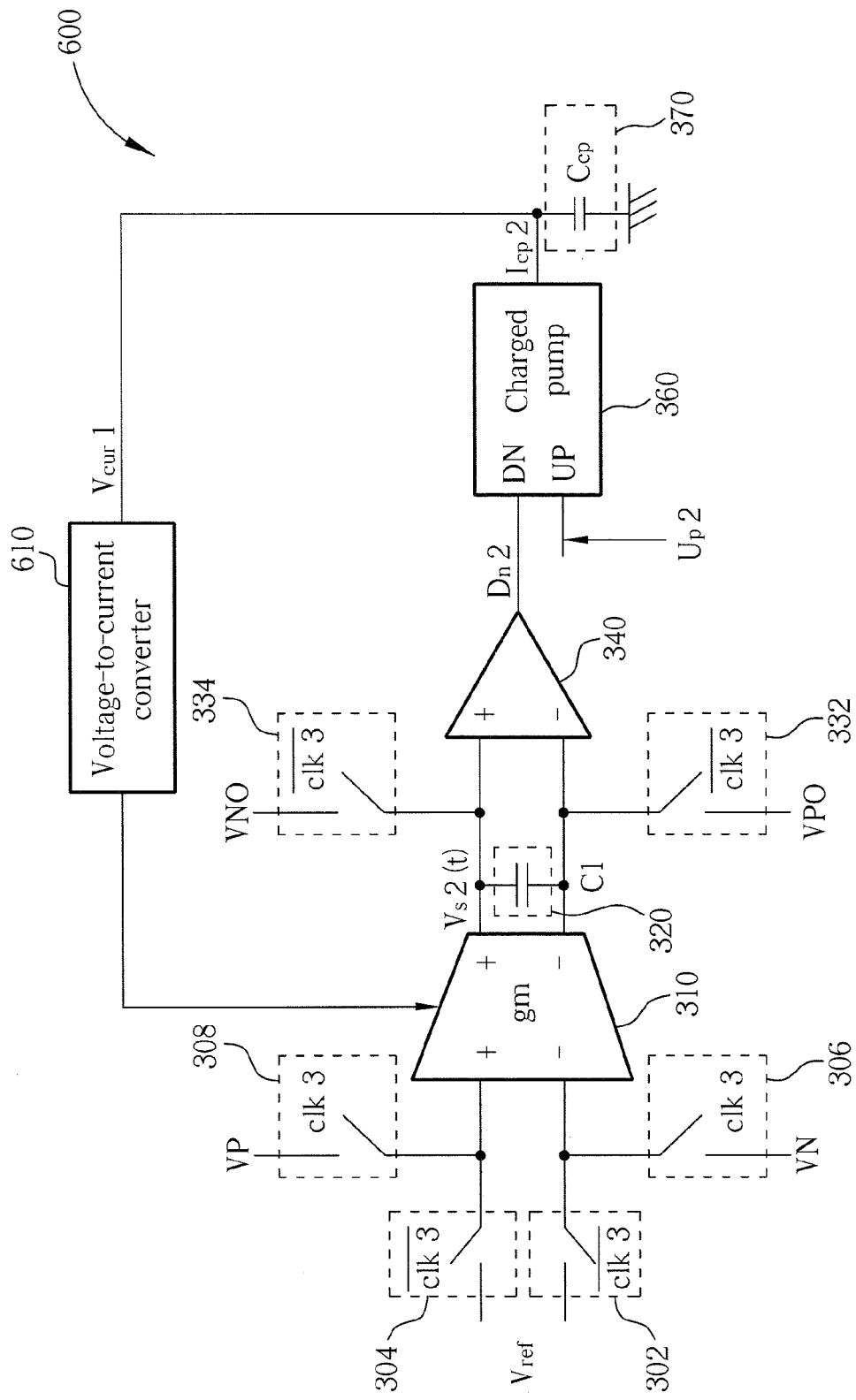
FIG. 7 illustrates a diagram of a third embodiment of the Gm-C time constant tuning circuit.

Please refer to FIG. 7 for an illustration of a third embodiment of the present invention. FIG. 7 is a tuning circuit 600 that comprises the components and functionality of the tuning circuit 300 of FIG. 3. The difference between the tuning circuits 300 and 600 is that the tuning circuit 600 further comprises a voltage-to-current-converter 610 coupled between the feedback capacitor 370 and the reference conductor 310 so that the control signal received by the reference conductor 310 is current based.

Figure 8:
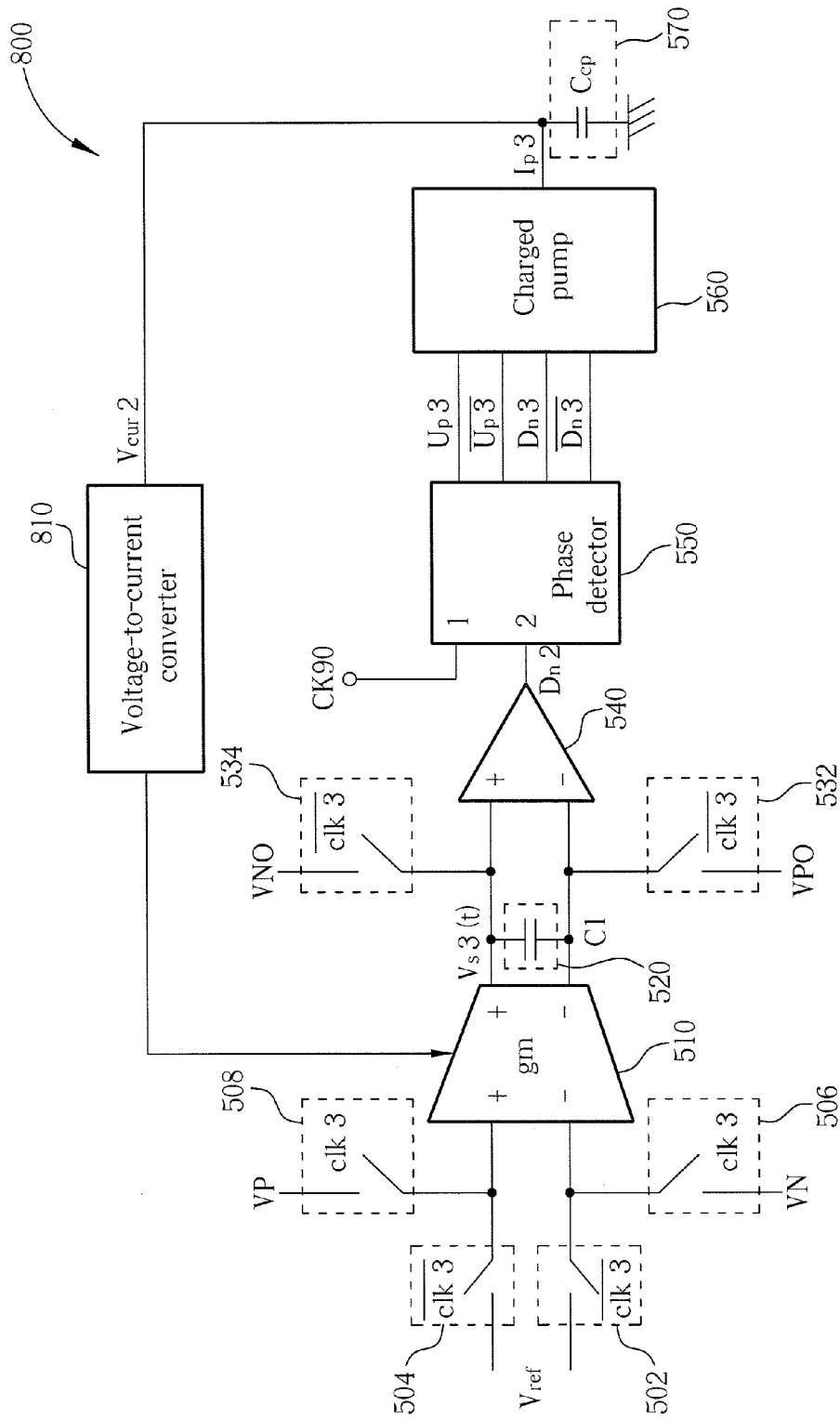
FIG. 8 illustrates a diagram of a fourth embodiment of the Gm-C time constant tuning circuit.

Please refer to FIG. 8 for an illustration of a fourth embodiment of the present invention. FIG. 8 is a tuning circuit 800 that comprises the components and functionality of the tuning circuit 500 of FIG. 6. The difference between the tuning circuits 500 and 800 is that the tuning circuit 800 further comprises a voltage-to-current-converter 810 coupled between the feedback capacitor 570 and the reference conductor 510 so that the control signal received by the reference conductor 510 is current based.

The tuning circuit 300 of FIG. 3 and the tuning circuit 500 of FIG. 6 are different embodiments of tuning Gm-C time constant circuit of the present invention. In comparison to the prior art, the circuit in the two embodiments of the present invention utilizes only a single comparator to reduce surface area and power consumption of the tuning circuit. However, there is still a difference between the two embodiments of the present invention, in short, in that the tuning circuit 300 of FIG. 3, the charged pump 360 discharges and charges the feedback capacitor 370 according to a level of the output signal of the comparator 340; and in the tuning circuit 500 of FIG. 6, the discharging and charging of the charged pump 560 on the feedback capacitor 570 is related to the position of the output signal of the comparator 540. And when the embodiment 300 of the tuning circuit of the present invention collocates with the clock generating circuit 400 of FIG. 4, as the clock generating circuit 400 obtains the signal Up2 from the clock signal CK90, the clock signal clk3 and an algorithm AND, the clock generating circuit 400 is capable of avoiding the problem of signal lag in the comparator 340. During the stable state, the pulse lengths of the signals Up2 and Dn2 where each is ¼ cycle length of the product of (0.25) and (Tclk3) of the clock signal clk3, even if a signal lag in the comparator 340 will only affect the pulse time of the signal Dn2 to be slightly later then the pulse time of the signal Up2, thus the pulse lengths are not affected. However, for the second embodiment 500 of the tuning circuit of the present invention, as a tri-state phase detector watches only the rising edge of the output signal of the comparator 540, when at the stable state, the reference conductor 510 will compensate the lag effect of the comparator 540 caused by the shrinking pulse of the signal Dn3 with a displacement quantity; therefore when the tuning circuit 500 enters into a stable state, wave motion of the control voltage Vcon3 is slightly greater than wave motion of the control voltage Vcon2 when the tuning circuit 300 enters into a stable state. Comparatively, for the tuning circuit that utilizes the phase detector, take the second embodiment 500 of the tuning circuit of the present invention and the conventional tuning circuit for example, in the first embodiment 300 of the present invention as the charged pump 360 is coupled directly to the comparator 340 which causes the current outputted by the charged pump 360 to be more stable. When the tuning circuit 300 enters into the stable state, the pulse lengths of the signals Up2 and Dn2 are equal so that the current lcp2 charging and discharging the feedback capacitor 370 is symmetrical, and at the moment of charging and discharging will not be executed on the feedback capacitor 370; thus Vcon2 will not be affected by disturbance of cycles. Furthermore, after the tuning circuit 300 enters into the stable state, the charged pump 360 can still receive pulse signals and therefore the problem of dead zone of the charged pump can be prevented.

In conclusion, the present invention provides an automatic tuning Gm-C filter of a Gm-C time constant tuning circuit. The Gm-C time constant tuning circuit of the present invention does not require a conventional PLL method to copy a slave filter, the reference conductor and the reference capacitor of the tuning circuit of the present invention are of the smallest conductor and capacitor capable of copying the Gm-C constant filter being tuned, and the structure of the feedback process circuit is relatively simple such that the circuit surface area and power consumption requirements can be reduced. Furthermore, the Gm-C time constant tuning circuit of the present invention is capable of continuously and actively adjusting the control voltage of the conductance when the circuit is operating according to the Gm-C constant offset on the chip to correct the Gm-C time constant, so that variation of Gm-C time constant filter caused by change in temperature, voltage, and pressure can be prevented. In the embodiment of the present invention, the reference conductor is utilized for adjusting conductance value according to the control voltage received; and the tuning circuit of the present invention can also adjust the conductance of the conductance value according to the control current received, then the tuning circuit can further comprise a voltage-to-current converter coupled to the feedback capacitor and the reference conductor for converting the control voltage generated by the feedback capacitor into a control current to adjust the conductance of the reference conductor, also the voltage-to-current converter can couple to the conductance of the filter for adjusting the Gm-C time constant of the filter. Furthermore, according to the design of the present invention, the reference signal utilized by the tuning circuit can be simplified. Yet the simplified reference signal does not affect the tuning process or results, hence, the errors like manufacturing variation and offset can be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Gm-C time constant tuning circuit for tuning a Gm-C time constant of a Gm-C filter, wherein the Gm-C filter comprises a set of conductors and a set of capacitors, the tuning circuit comprising:

a reference conductor for receiving a plurality of reference voltages and a control signal and outputting two current signals according to the voltage signal and the control signal;

a reference capacitor cross-over coupled in between two output terminals of the reference conductor;

a comparator comprising two input terminals coupled to the output terminals of the reference conductor respectively, the output terminal of the comparator outputting a first reference signal;

a charged pump coupled to the comparator for outputting a reference current according to the first reference signal or a second reference signal;

a feedback capacitor coupled in between the charged pump and the reference conductor for generating the control signal according to the reference current and feeding the control signal back to the reference conductor; wherein the tuning circuit utilizes the control signal to adjust a conductance of the reference conductor;

a first switch, a terminal of the first switch receiving a first reference voltage, another terminal of the first switch coupled to a first input terminal of the reference conductor;

a second switch, a terminal of the second switch receiving the first reference voltage, another terminal of the second switch coupled to a second input terminal of the reference conductor;

a third switch, a terminal of the third switch receiving a second reference voltage, another terminal of the third switch coupled to the first input terminal of the reference conductor;

a fourth switch, a terminal of the fourth switch receiving a third reference voltage, another terminal of the fourth switch coupled the second input terminal of the reference conductor;

a fifth switch, a terminal of the fifth switch receiving a fourth reference voltage, another terminal of the fifth switch coupled a first input terminal of the comparator; and a sixth switch, a terminal of the sixth switch receiving a fifth reference voltage, another terminal of the sixth switch coupled a second input terminal of the comparator;

wherein the first switch, the second switch, the third switch, and the fourth switch are controlled to select whether the input terminal of the reference conductor is coupled to the reference voltage according to a clock signal, wherein the fifth switch and the sixth switch are controlled to select whether the output terminal of the reference conductor is coupled to the fourth reference voltage or the fifth voltage according to the clock signal.

2. The tuning circuit of claim 1 wherein a difference of the first reference voltage and the second reference voltage and a difference of the first reference voltage and the third reference voltage are equal.

3. The tuning circuit of claim 1 wherein a difference of the first reference voltage and the fourth reference voltage and a difference of the first reference voltage and the fifth reference voltage are equal.

4. The tuning circuit of claim 1 wherein the second reference signal received by the charged pump is a signal of the clock signal divided by four.

5. The tuning circuit of claim 1 further comprising:
a phase detector coupled in between the comparator and the charged pump for receiving the first reference signal outputted by the comparator and a third reference signal, detecting phases of the first reference signal and a third reference signal, and outputting a fourth signal according to the phases of the first reference signal and the third reference signal.

6. The tuning circuit of claim 5 wherein the charged pump outputs the reference current according to the fourth reference signal.

7. The tuning circuit of claim 1 wherein the control signal outputted by the feedback capacitor is a voltage signal.

8. The tuning circuit of claim 7 further comprising:
a voltage-to-current converter coupled in between the feedback capacitor and the reference conductor for converting the control signal generated by the feedback capacitor into a current signal.

9. The tuning circuit of claim 8 wherein the current signal is utilized to adjust conductance value of the reference conductor.

10. The tuning circuit of claim 1 wherein the reference conductor is a smallest conducting unit of the Gm-C filters.

11. The tuning circuit of claim 1 wherein the reference capacitor is a smallest capacitor of the Gm-C filters.

12. A semi-conductor component having a Gm-C filter, the semi-conductor comprising:
a Gm-C filter having a set of conductors and a set of capacitors; and
a tuning circuit for tuning a Gm-C time constant of the Gm-C filter, wherein the tuning circuit comprises:
a reference conductor for receiving a plurality of reference voltages and a control signal and outputting two current signals according to the voltage signals and the control signal received;
a reference capacitor cross-over in between two output terminals of the reference conductor;
a comparator comprising two input terminals coupled to the output terminals of the reference conductor respectively, the output terminal of the comparator outputting a first reference signal;
a charged pump coupled to the comparator for outputting a reference current according to the first reference signal or a second reference signal;
a feedback capacitor coupled in between the charged pump and the reference conductor for generating the control signal according to the reference current and feeding the control signal back to the reference conductor;
a first switch, a terminal of the first switch receiving a first reference voltage, another terminal of the first switch coupled to a first input terminal of the reference conductor;
a second switch, a terminal of the second switch receiving the first reference voltage, another terminal of the second switch coupled to a second input terminal of the reference conductor;
a third switch, a terminal of the third switch receiving a second reference voltage, another terminal of the third switch coupled to the first input terminal of the reference conductor;
a fourth switch, a terminal of the fourth switch receiving a third reference voltage, another terminal of the fourth switch coupled the second input terminal of the reference conductor;
a fifth switch, a terminal of the fifth switch receiving a fourth reference voltage, another terminal of the fifth switch coupled a first input terminal of the comparator; and
a sixth switch, a terminal of the sixth switch receiving a fifth reference voltage, another terminal of the sixth switch coupled a second input terminal of the comparator;
wherein the first switch, the second switch, the third switch, and the fourth switch are controlled to select whether the input terminal of the reference conductor is coupled to the reference voltage according to a clock signal, wherein the fifth switch and the sixth switch are controlled to select whether the input terminal of the reference conductor is coupled to the fourth reference voltage or the fifth voltage according to the clock signal and the tuning circuit utilizes the control signal to adjust a conductance value of the reference conductor and the set of conductors.

13. The semi-conductor of claim 12 wherein a difference of the first reference voltage and the second reference voltage and a difference of the first reference voltage and the third reference voltage are equal.

14. The semi-conductor of claim 12 wherein a difference of the first reference voltage and the fourth reference voltage and a difference of the first reference voltage and the fifth reference voltage are equal.

15. The semi-conductor of claim 12 wherein the second reference signal received by the charged pump is a signal of the clock signal divided by four.

16. The semi-conductor of claim 12 further comprising:
a phase detector coupled in between the comparator and the charged pump for receiving the first reference signal outputted by the comparator and a third reference signal, detecting phases of the first reference signal and a third reference signal, and outputting a fourth reference signal according to the phases of the first reference signal and the third reference signal.

17. The semi-conductor of claim 16 wherein the charged pump outputs a control current according to the fourth reference signal.

18. The semi-conductor of claim 12 wherein the control signal generated by the feedback capacitor is a voltage signal.

19. The semi-conductor of claim 18 further comprising:
a voltage-to-current converter coupled in between the feedback capacitor and the reference conductor for converting the control signal generated by the feedback capacitor into a current signal.

20. The semi-conductor of claim 19 wherein the current signal is utilized to adjust the conductance value of the reference conductor and the set of conductors.

21. The semi-conductor of claim 12 wherein the reference conductor is a smallest conducting unit of the Gm-C filters.

22. The semi-conductor of claim 12 wherein the reference capacitor is a smallest capacitor of the Gm-C filters.

* * * * *